(12) United States Patent
Kunz et al.

(10) Patent No.: US 9,252,771 B2
(45) Date of Patent: Feb. 2, 2016

(54) LAYER STRUCTURE COMPRISING A SWITCH ILLUMINATED BY AN ACPEL ARRANGEMENT

(75) Inventors: Rainer Kunz, Holzappel (DE); Thomas Bernert, Leverkusen (DE); Wilfried Hedderich, Hilden (DE)

(73) Assignee: T+ink, Inc., New York, NY (US)

( * ) Notice: Subject to any disclaimer, the term of this patent is extended or adjusted under 35 U.S.C. 154(b) by 215 days.

(21) Appl. No.: 13/822,756

(22) PCT Filed: Sep. 12, 2011

(86) PCT No.: PCT/EP2011/065781
§ 371 (c)(1),
(2), (4) Date: May 28, 2013

(87) PCT Pub. No.: WO2012/034981
PCT Pub. Date: Mar. 22, 2012

(65) Prior Publication Data
US 2013/0241688 A1    Sep. 19, 2013

(30) Foreign Application Priority Data
Sep. 13, 2010    (EP) .................................... 10176370

(51) Int. Cl.
*H03K 17/96*    (2006.01)
*H01B 1/24*    (2006.01)
*H05B 33/26*    (2006.01)
*H05B 33/28*    (2006.01)

(52) U.S. Cl.
CPC .............. *H03K 17/9631* (2013.01); *H01B 1/24* (2013.01); *H03K 17/962* (2013.01); *H03K 17/9645* (2013.01); *H05B 33/26* (2013.01); *H05B 33/28* (2013.01); *H03K 2017/9602* (2013.01); *H03K 2217/960785* (2013.01)

(58) Field of Classification Search
CPC ............................................... H03K 2017/9613
See application file for complete search history.

(56) References Cited

U.S. PATENT DOCUMENTS

| 5,680,160 | A  | 10/1997 | LaPointe |
| 5,932,167 | A  | 8/1999 | Fritz et al. |
| 6,210,623 | B1 | 4/2001 | Fritz et al. |
| 6,257,866 | B1 | 7/2001 | Fritz et al. |
| 6,272,936 | B1 | 8/2001 | Oreper et al. |

(Continued)

FOREIGN PATENT DOCUMENTS

| DE | 102006059203 A1 | 6/2008 |
| DE | 102009017669 A1 | 12/2009 |

(Continued)

OTHER PUBLICATIONS

International Search Report for Application No. PCT/EP2011/065781 dated Oct. 13, 2011.

(Continued)

*Primary Examiner* — James Harvey
(74) *Attorney, Agent, or Firm* — Lerner, David, Littenberg, Krumholz & Mentlik, LLP

(57) ABSTRACT

The invention relates to a layer structure comprising at least one switch (4) illuminated by an ACPEL arrangement (2), to the method for producing and shaping said layer structure, and the use thereof for forming display and control elements and for forming housing elements for mobile or stationary electronic equipment or small or large household appliances or for forming keyboard systems without movable components.

20 Claims, 6 Drawing Sheets

(56) References Cited

U.S. PATENT DOCUMENTS

| | | |
|---|---|---|
| 2005/0029114 A1* | 2/2005 | Tripp et al. .................. 205/316 |
| 2005/0206623 A1 | 9/2005 | Hein et al. |
| 2006/0087829 A1 | 4/2006 | Manico et al. |
| 2007/0041169 A1 | 2/2007 | Konet et al. |
| 2007/0082578 A1* | 4/2007 | Haynes ......................... 446/220 |
| 2008/0202912 A1 | 8/2008 | Boddie et al. |

FOREIGN PATENT DOCUMENTS

| | | |
|---|---|---|
| EP | 0371425 A2 | 6/1990 |
| EP | 1887595 A1 | 2/2008 |
| WO | 03037039 A1 | 5/2003 |
| WO | 2005043961 A2 | 5/2005 |
| WO | 2008131305 A1 | 10/2008 |
| WO | 2009027387 A1 | 3/2009 |
| WO | 2009043539 A2 | 4/2009 |

OTHER PUBLICATIONS

International Preliminary Report on Patentability for Application No. PCT/EP2011/065781 dated Mar. 19, 2013.

* cited by examiner

LAYER STRUCTURE COMPRISING A SWITCH ILLUMINATED BY AN ACPEL ARRANGEMENT

The present application is a national phase entry under 35 U.S.C. §371 of International Application No. PCT/EP2011/065781, filed Sep. 12, 2011, published in German, which claims priority from European Application No. 10176370.4 filed Sep. 13, 2010, all of which are hereby incorporated herein by reference.

FIELD OF THE INVENTION

The object of the present invention is a layer structure, which comprises at least one switch illuminated by an ACPEL assembly (ACPEL=alternating current powder electroluminescence), the method for producing and shaping this layer structure, and the use thereof to form small and large display and control elements and to form housing elements for mobile or stationary electronic equipment or small or large household appliances or to form keyboard systems without moving parts.

BACKGROUND

Switches frequently have a background illumination, which makes it possible to find and actuate the switch in a hallway or on a device, for example, on a household appliance, even in darkness or inadequate illumination conditions. In addition, a corresponding illumination can also indicate the status of the switch, such as the on/off state.

In general, LEDs (LED=light-emitting diode) or ACPEL arrangements are used as light sources for the background illumination of switches; further common designations for ACPEL arrangements are: electroluminescence elements, electroluminescence arrangements, or electroluminescence devices, wherein electroluminescence is typically abbreviated with EL.

The combination of switch and background illumination is often constructed from at least two separate units, for example, from a mechanical switch and corresponding LEDs or a mechanical switch and ACPEL arrangements.

These combinations known from the prior art of illuminated switches made of separate elements have the disadvantage that their provision is costly and subject to failure because of the use of mechanical parts. In addition, further disadvantages arise, such as higher weight, restricted shape freedom and therefore restricted design freedom, and a large installation depth.

In addition, layer structures are known from the prior art, in which non-mechanical switches are backlit using LEDs or ACPEL arrangements.

Thus, WO2008/131305A1 discloses a printed capacitive switch, which is backlit by LEDs. US2005/0206623A1 discloses a capacitive switch, which is backlit by an ACPEL arrangement. US2008/202912A1 discloses a capacitive switch, which is backlit by LEDs or OLEDs (OLED=organic light-emitting diode).

ACPEL arrangements are frequently obtainable by way of a printing method.

These combinations of illuminated switches have the advantage in relation to illuminated switches made of separate elements that they do not have any mechanical parts and are therefore less susceptible to failure, and they have a lower weight. In addition, these combinations form uninterrupted surfaces at least on the side facing the user. Such surfaces are easier to keep clean, on the one hand, and they provide a higher-quality aesthetic impression, on the other hand.

The combinations of illuminated switches disclosed in the above-mentioned intellectual property have the disadvantage that they only provide flat or slightly curved planar parts, or the switch is deformed three-dimensionally, as in the case of WO2008/131305A1, while the backlighting is provided by LEDs. Since these LEDs cannot be shaped, the background illumination of the deformed switch is not free of shadows, nor uniform.

It has been known since WO03/037039A1 that ACPEL arrangements can be deformed three-dimensionally nearly arbitrarily. However, these arrangements have heretofore only been used for the purpose of backlighting three-dimensionally deformed displays, without shadows and uniformly. These displays have no further electrotechnical components in the deformed region except for the ACPEL arrangement, however.

Backlighting three-dimensionally deformed electrotechnical components, for example, a switch, using a similarly three-dimensionally deformed ACPEL arrangement is not known from the prior art.

Attempts to build such switches have heretofore failed because delamination of the layer structure occurred during the shaping as a result of the drawing and compression of the various layers, which delamination damaged the entire part and therefore also its functional capability.

In addition, interference of the ACPEL operating voltage with the switching signal of the switch occurred in the switches known from the prior art. The switching signal of the switches was interfered with by the AC voltage, using which the ACPEL arrangement is operated, in such a manner that detection of a switching procedure was made more difficult or impossible.

SUMMARY

The object of the present invention is to provide a layer structure, which has at least one combination of switch and background illumination, wherein both the switch and also the background illumination are applied to the same substrate and both the switch and also the background illumination are three-dimensionally deformed in such a manner that the background illumination backlights the switch uniformly and without shadows. In addition, delamination of the layer structure is not to occur during the deforming action. The ACPEL operating voltage is also not to interfere with the switching signal of the switch. This layer structure is to be obtainable by a simple production method and is to be usable in manifold applications.

The object is implemented according to the invention by a layer structure comprising a switch and an ACPEL arrangement, wherein the switch and the ACPEL arrangement are applied to one another in an arbitrary sequence on the same side of the same substrate, wherein the switch comprises a front electrode and a rear electrode, and wherein the ACPEL arrangement comprises a front electrode and a rear electrode, in that the switch and ACPEL arrangement are each three-dimensionally deformed, wherein independently of one another the rear electrode of the ACPEL arrangement and the front and the rear electrodes of the switch contain an electrically conductive material selected from the group consisting of an intrinsically conductive polymer and silver, and the front electrode of the ACPEL arrangement contains an intrinsically conductive polymer.

Further preferred embodiments are found in the subclaims.

DETAILED DESCRIPTION

In order that optimum adhesion and shaping capability of the layered structure are ensured, the layers must be adapted to one another with respect to their chemical components and physical properties. The selection of the material of the electrodes of the ACPEL arrangement and the electrodes of the switch are particularly critical in this case.

It has surprisingly been found here that the layer structure also survives strong deforming action without delamination occurring or the functional capability being lost, if, independently of one another, the rear electrode of the ACPEL arrangement and the front and rear electrodes of the switch contain an electrically conductive material selected from the group of intrinsically conductive polymers and silver, and the front electrode of the ACPEL arrangement contains an intrinsically conductive polymer.

According to one embodiment of the invention, the rear electrode of the ACPEL arrangement and the front and the rear electrodes of the switch contain, independently of one another, at least 20 wt.-%, preferably at least 30 wt.-%, particularly preferred at least 40 wt.-% of an intrinsically conductive polymer, or at least 50 wt.-%, preferably at least 60 wt.-% silver; the front electrode of the ACPEL arrangement contains at least 20 wt.-%, preferably at least 30 wt.-%, particularly preferred at least 40 wt.-% of an intrinsically conductive polymer. Of course, the pastes or other formulations for producing the electrodes contain smaller proportions of intrinsically conductive polymers or silver, respectively, since the pastes or formulations contain large parts of solvent, which escape during further processing.

Intrinsically conductive polymers which are suitable for the layer structure according to the invention are, for example, PEDOT:PSS (poly(3,4-ethylene dioxythiophene)poly(styrene sulfonate)), which are sold by H. C. Starck GmbH under the trade name Clevios and by the Agfa-Gevaert Group under the trade name ORGACON, or polyaniline, polypyrrole or polythiophene, or mixtures of these polymers.

Since an electrode containing silver according to the invention is not transparent, in contrast to an electrode containing intrinsically conductive polymer according to the invention, an electrode containing silver cannot be used for the front electrode of the ACPEL arrangement, since no light can be emitted through an electrode containing silver.

As defined in the present invention, transparent means, with respect to a specific layer, that at least 50%, preferably at least 65%, particularly preferred at least 80% of the light emitted from the ACPEL arrangement in the direction of the layer passes through this layer.

Switch and ACPEL arrangement can be applied in arbitrary sequence onto the substrate, i.e., the switch can be applied first onto the substrate and then the ACPEL arrangement or vice versa. The electrodes of the switch do not necessarily have to contain the intrinsically conductive polymers even if the ACPEL arrangement is applied first to the substrate, and then the switch. Rather, the electrodes of the switch can also contain silver, since the planar dimensions of the switch are typically smaller—in some cases much smaller—then the planar dimensions of the ACPEL arrangement. The switch can thus, for example, be made of only a thin line of approximately 100 µm line width; in addition, the switch can be designed in the form of a symbol, which indicates the function which is switched by the switch, for example.

Alternatively or additionally, the switch or the contours of the switch can be covered by a graphic layer, if one is provided. If a graphic layer is provided, the ACPEL arrangement preferably lies behind the graphic layer, from the perspective of the observer/operator of the switch structure according to the invention. The graphic layer preferably lies, from the perspective of the observer/operator behind the substrate—independently of whether the switch is applied first to the substrate and then the ACPEL arrangement or vice versa—since the graphic layer is then protected from wear. Alternatively, if the graphic layer lies, from the perspective of the observer/operator, in front of the substrate, the graphic layer can be provided with an additional protective layer. The graphic layer is only light-opaque in parts, i.e., not over the entire area. Information about the function of the switch, the layer structure, and/or an aesthetic illustration can be shown to the observer/operator by the design of the transparent and opaque regions of the graphic layer.

In a preferred embodiment of the invention, the rear electrode of the ACPEL arrangement is made of silver, since the light of the ACPEL arrangement, which is not emitted in the direction of the observer/operator, is thus reflected.

To prevent the ACPEL operating voltage from interfering with the switching signal of the switch, the layers of the ACPEL arrangement are separated from the layers of the switch by an insulation layer. This insulation layer is necessarily transparent if first the switch is applied to the substrate and then the ACPEL arrangement is applied thereon. If first the ACPEL arrangement is applied to the substrate and then the switch is applied, the insulation layer can be transparent, but it can also be opaque.

For example, layers made of polyurethane-based or polycarbonate-based clear lacquers are suitable as insulation layers, such as the commercially available insulation compositions which are sold under the trade names Noriphan HTR, Noriphan PCI, Noriphan N2K, Noricryl, and NoriPET by the Pröll KG, Weißenburg in Bayern, Germany; or under the trade names Maraflex FX, Ultraflex UVF, or Ultraform UVFM by Marabu GmbH & Co. KG, Tamm, Germany; or under the trade name Polyplast PY by Fujifilm Sericol Deutschland GmbH.

The thickness of the insulation layer is between 20 and 100 µm, preferably between 30 and 80 µm, particularly preferred between 40 and 70 µm. This insulation layer additionally prevents an electrical short-circuit between the switch and the ACPEL arrangement.

The switch can be a capacitive switch or also a resistive switch. Printable resistive switches are known from EP1887595A1 and US6272936B1.

This layer structure has the advantages that it does not have any mechanical parts, and is therefore less sensitive to interference, has a low weight and is very thin, forms an uninterrupted surface on the side facing toward the user, whereby it is easier to keep clean and provides a higher-quality aesthetic impression, and the switch is backlit uniformly and without shadows. An operator can both see and also feel the switch due to the three-dimensional deforming of both the switch and also the ACPEL arrangement.

In addition, both the ACPEL arrangement and also the capacitive or resistive switch of the layer structure are obtainable easily and cost-effectively by way of a printing method.

The layer structure according to the invention can be used to form large and small display and control elements, and to form housing elements for mobile or stationary electronic equipment or small or large household appliances, or to form keyboard systems without moving parts.

As already described, ACPEL arrangements, also those which are three-dimensionally deformed, are known. In the present invention, those ACPEL arrangements as disclosed in WO 2009/027387A1 and DE 10 2009 017669 A1 are preferably used.

As also already described, shaped capacitive switches are known. Those capacitive switches, which are disclosed in WO2008/131305A1, are preferably used in the present invention.

As already noted, however, shaping a layer structure comprising an ACPEL arrangement together with a switch is not known.

ACPEL arrangements per se can be deformable three-dimensionally in such a manner that the radii of curvature of the deformed regions are smaller than 2 mm, preferably smaller than 1 mm. The angle of deformation can be greater than 600, preferably greater than 75°, particularly preferred greater than 90°, very particularly preferred greater than 105°. The layer structure according to the invention comprising a switch and an ACPEL arrangement is three-dimensionally deformable in such a manner that the radii of curvature, measured on the inner side of the curvature of the substrate, in the formed regions can be smaller than 7 mm, preferably smaller than 5 mm, particularly preferred smaller than 3 mm, very particularly preferred smaller than 1 mm. The angle of deformation in the deformed regions can be greater than 600, preferably greater than 75°, particularly preferred greater than 90°, very particularly preferred greater than 105°.

Three-dimensional shaping as defined in the present invention relates to any type of shaping of the layer structure out of a two-dimensional plane, which can thus mathematically no longer be described by a linear combination of two linear independent vectors. The normal, production-related irregularities of the surface of the substrate, which can be in an order of magnitude of at most +/− approximately 20 μm deviating from the target value of the substrate, are not taken into consideration in this case.

Three-dimensionally deformed means in particular that indentations or protrusions into or out of a substantially planar surface are present, wherein the indentations and protrusions can have arbitrary cross-sections, in particular round, especially circular, polygonal, in particular regularly polygonal, or also toroidal like a ring pressed out of a surface. "Three-dimensionally deformed" does not only mean that a surface was only bent, buckled, or corrugated in one spatial direction.

The ACPEL arrangement, the insulation layer, and also the capacitive switch are all applied by a printing method, for example, by screen printing, intaglio printing, flexographic printing, gravure printing, digital printing, inkjet printing, or another printing method known to a person skilled in the art. The printing methods are easy to handle and cost-effective.

The shaping of the layer structure is performed, for example, by isostatic high-pressure forming (HPF), as disclosed in EP0371425A2 or WO2009/043539A2. Shaping by thermoforming, as disclosed in U.S. Pat. No. 5,932,167A, US6210623B1, and US6257866B1 is also possible. In particular, indentations and protrusions into or out of a surface may be achieved reliably and reproducibly using the HPF method.

The following method for producing the layer structure according to the invention results therefrom:
(a) providing a substrate,
(b) applying the layers of the ACPEL arrangement, an insulation layer, and the switch by a printing method, wherein the sequence is not fixed, and
(c) shaping the layer structure.

The three-dimensionally shaped layer structure can be injected with a plastic material, as also already disclosed in EP0371425A2 and WO2009/043539A2.

The layer structure according to the invention can be used to form small and large display and control elements, and to form housing elements for mobile or stationary electronic equipment or small or large household appliances, or to form keyboard systems without moving parts.

BRIEF DESCRIPTION OF THE DRAWINGS

The invention is schematically shown in greater detail hereafter on the basis of several embodiments; the features essential to the invention are to be emphasized, without restricting the invention thereto.

In the Figures.

LIST OF REFERENCE NUMERALS

Figure 1:
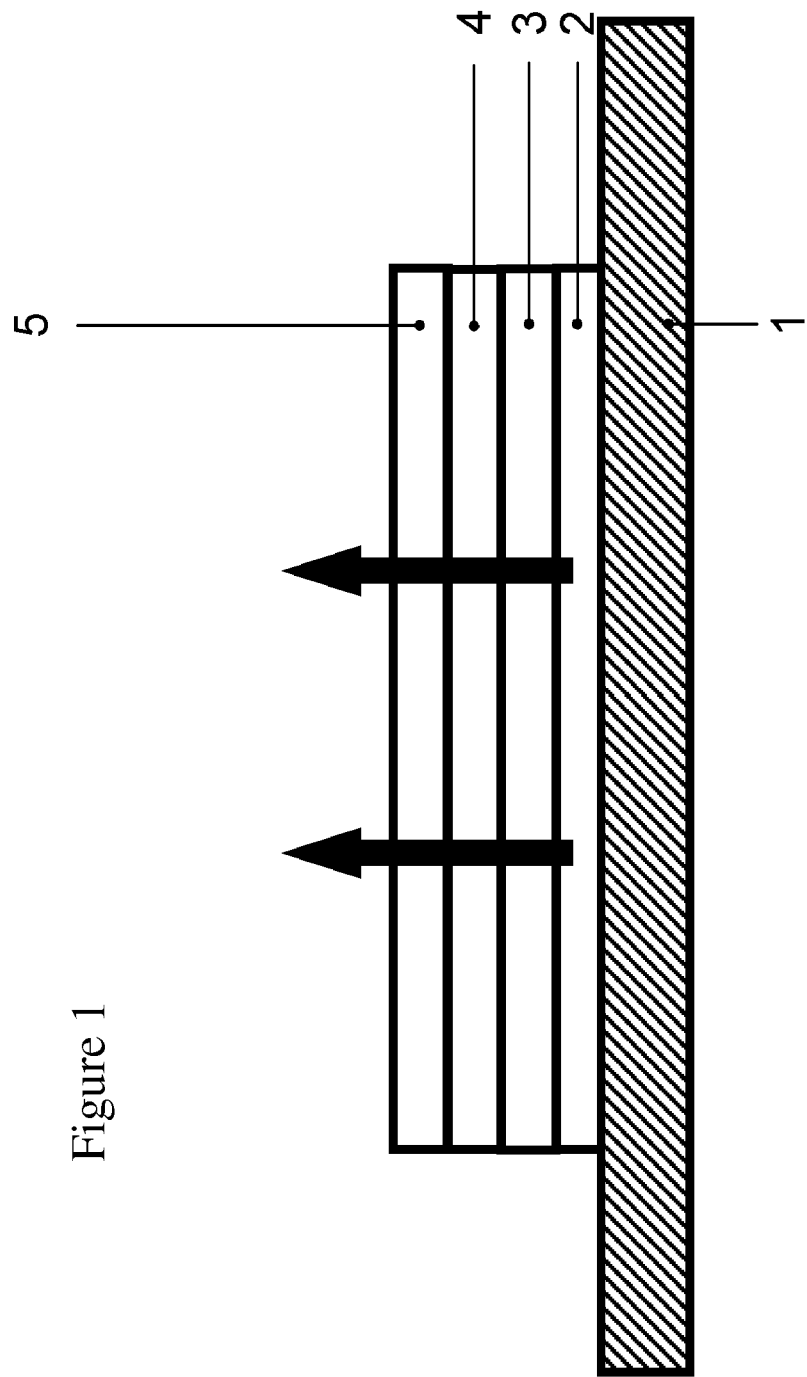
FIG. 1: shows a layer structure comprising a switch and an ACPEL arrangement, wherein first an ACPEL arrangement (2) and then a switch (4) are applied onto the substrate (1). An insulation layer (3) is applied between the ACPEL arrangement (2) and the switch (4). In addition, a graphic layer (5) is applied to the side of the ACPEL arrangement (2) facing away from the substrate (1). As shown by the arrows in FIG. 1, the ACPEL arrangement (2) emits light in the direction of the graphic layer (5)
Figure 2:
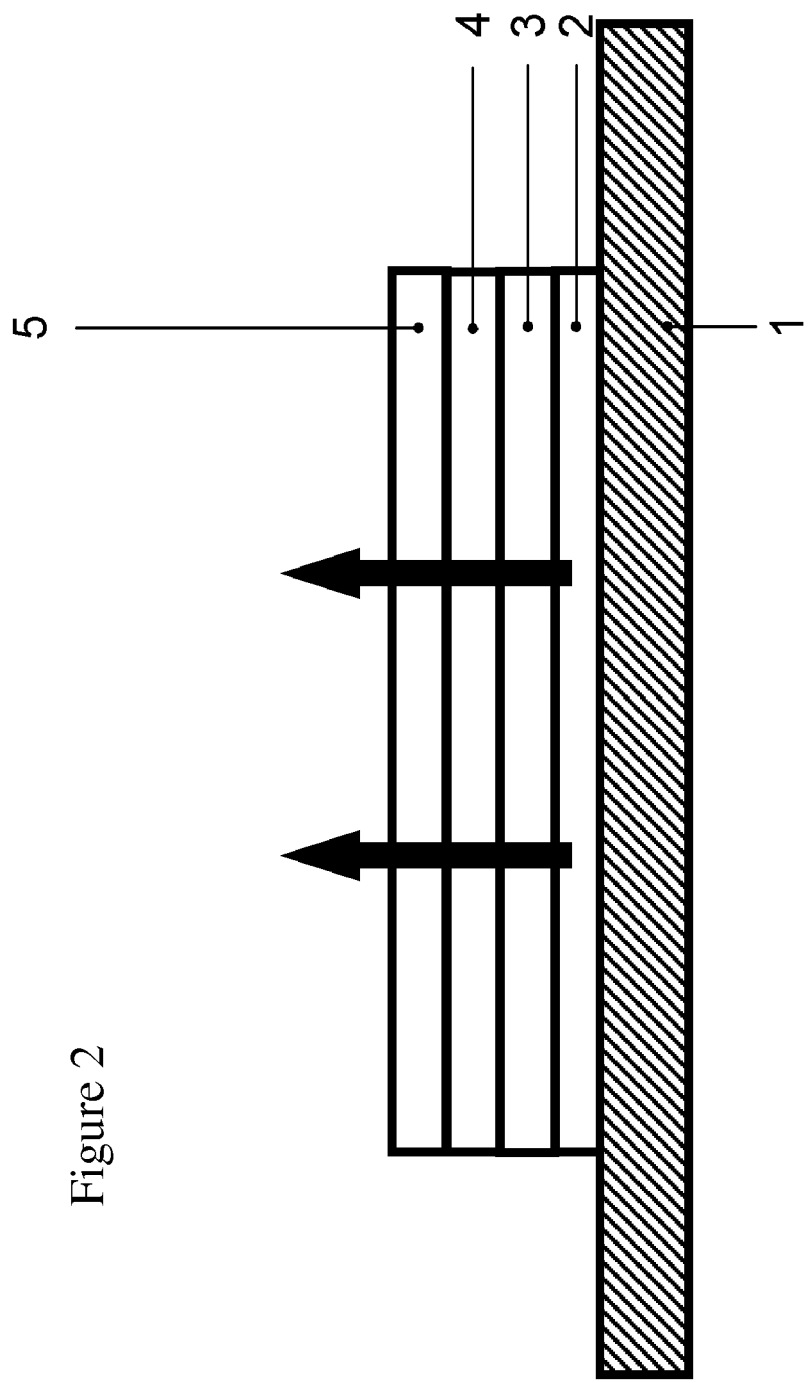
FIG. 2: shows a layer structure comprising a switch and an ACPEL arrangement, wherein first a switch (4) and then an ACPEL arrangement (2) are applied onto the substrate (1). An insulation layer (3) is applied between the switch (4) and the ACPEL arrangement (2). In addition, a graphic layer (5) is applied to the side of the ACPEL arrangement (2) facing away from the substrate (1). As shown by the arrows in FIG. 2, the ACPEL arrangement (2) again emits light in the direction of the graphic layer (5)
Figure 3:
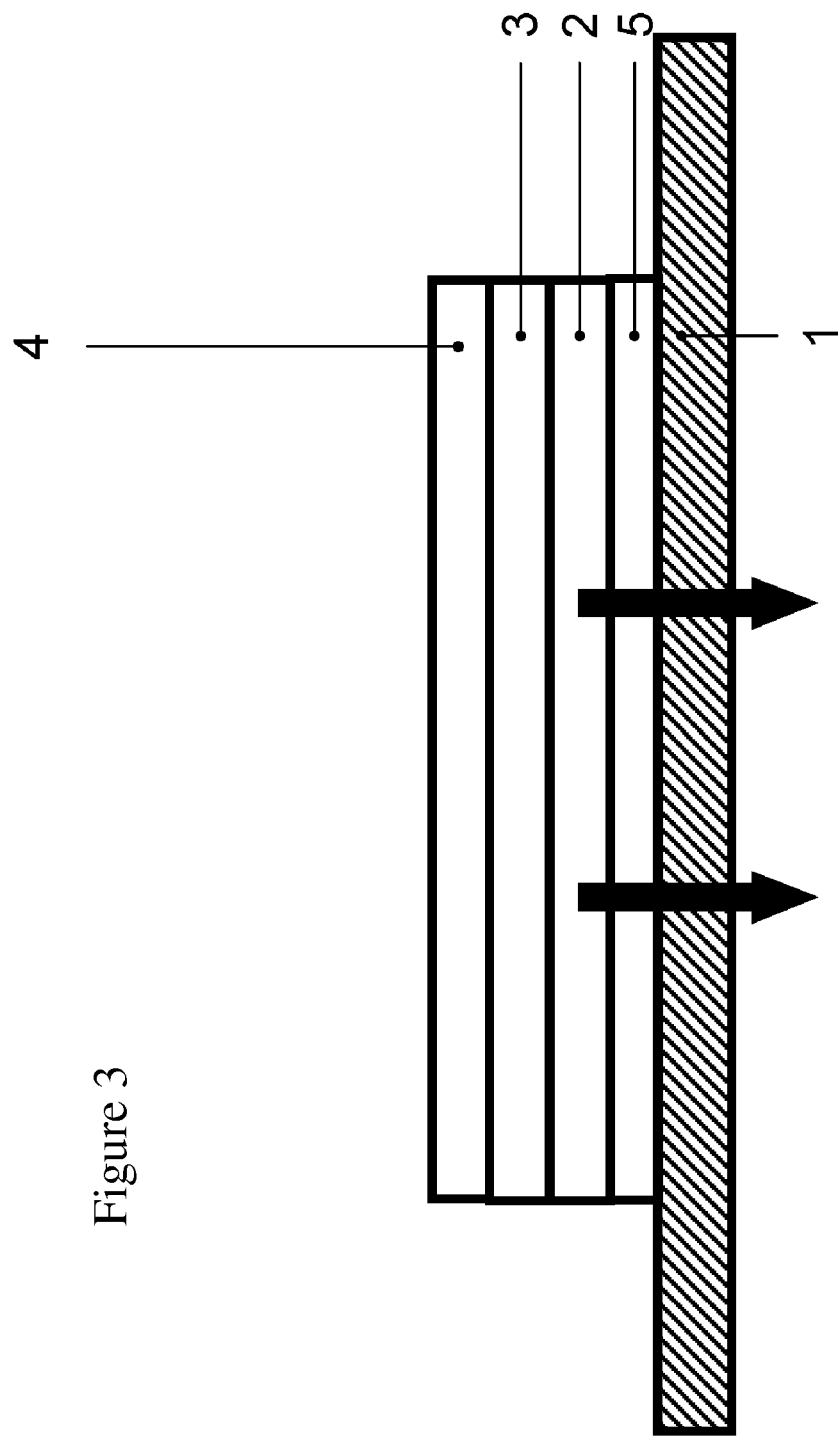
FIG. 3 shows a layer structure comprising a switch and an ACPEL arrangement, wherein first a graphic layer (5), then an ACPEL arrangement (2), and then a switch (4) are applied to the substrate (1). An insulation layer (3) is applied between the switch (4) and the ACPEL arrangement (2). The ACPEL arrangement (2) emits light in the direction of the graphic (5).
Figure 4:
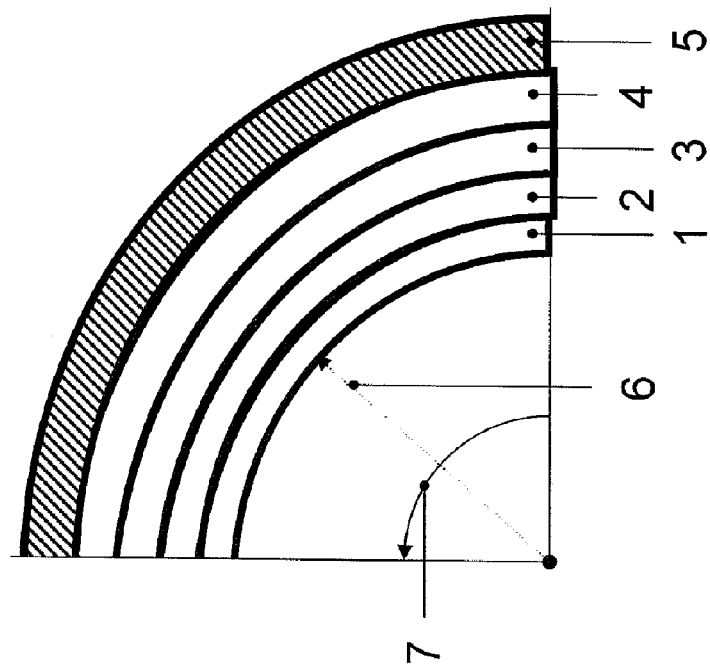
FIG. 4: shows a layer structure as in FIG. 1, wherein it is three-dimensionally deformed. As already described, the radius of curvature (6) on the inner side of the curve of the substrate is decreased. The angle of curvature (7) is also shown.
Figure 5:
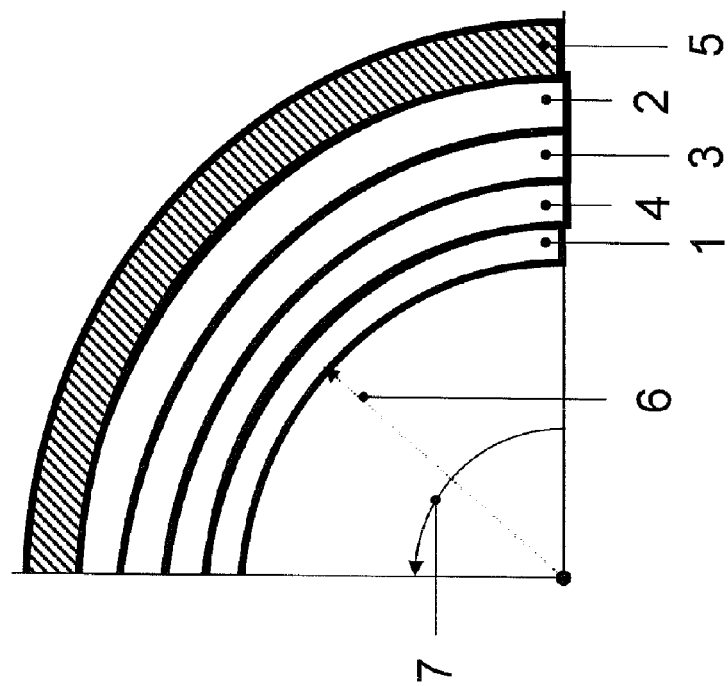
FIG. 5: shows a layer structure as in FIG. 2, wherein it is three-dimensionally deformed. As already described, the radius of curvature (6) is taken on the inner side of the curve of the substrate. The angle of curvature (7) is also shown.
Figure 6:
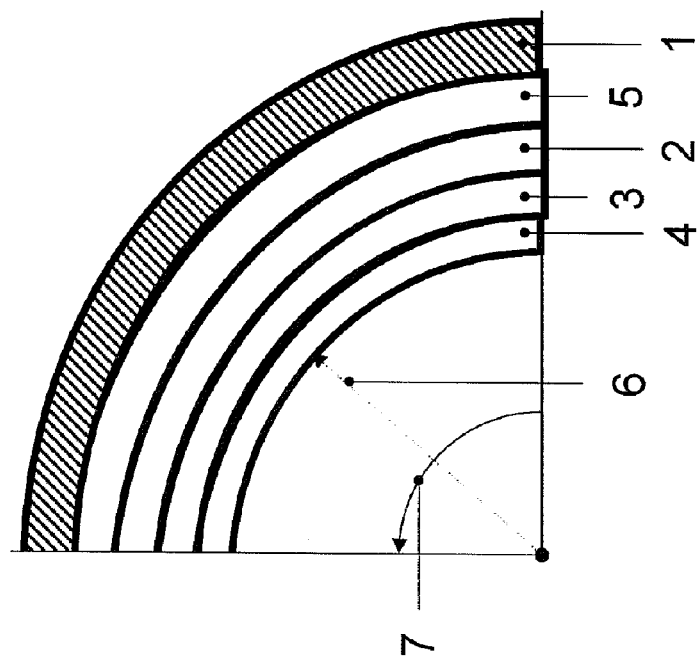
FIG. 6: shows a layer structure as in FIG. 3, wherein it is three-dimensionally deformed. As already described, the radius of curvature (6) is taken on the inner side of the curve of the substrate. The angle of curvature (7) is also shown.

1=substrate
2=ACPEL arrangement
3=insulation layer
4=switch
5=graphic layer
6=radius of curvature
7=angle of deformation

The invention claimed is:
1. A layer structure comprising a switch and an ACPEL arrangement, wherein the switch and the ACPEL arrangement are applied onto one another in arbitrary sequence to the same side of the same substrate, wherein the switch comprises a front electrode and a rear electrode, and wherein the ACPEL arrangement comprises a front electrode and a rear electrode, characterized in that the switch and ACPEL arrangement are each three-dimensionally deformed, wherein independently of each another the rear electrode of the ACPEL arrangement and the front and the rear electrodes of the switch contain an electrically conductive material selected from the group of intrinsically conductive polymer and silver, and the front electrode of the ACPEL arrangement contains an intrinsically conductive polymer.

2. The layer structure as claimed in claim 1, characterized in that the switch is a capacitive switch or a resistive switch.

3. The layer structure as claimed in claim 1, characterized in that the rear electrode of the ACPEL arrangement and the front and the rear electrodes of the switch, independently of one another, contain at least 20 wt.-% of an intrinsically conductive polymer, or at least 50 wt.-% silver, and the front electrode of the ACPEL arrangement contains at least 20 wt.-% of an intrinsically conductive polymer.

4. The layer structure as claimed in claim 1, characterized in that the intrinsically conductive polymer is selected from the group of PEDOT:PSS, polyaniline, polypyrrole, and polythiophene, or mixtures of these polymers.

5. The layer structure as claimed in claim 1, characterized in that the layers of the ACPEL arrangement are separated from the layers of the switch by an insulation layer.

6. The layer structure as claimed in claim 5, characterized in that the insulation layer is between 20 and 100 μm thick.

7. The layer structure as claimed in claim 1, characterized in that the radii of curvature in the deformed regions are smaller than 7 mm.

8. The layer structure as claimed in claim 1, characterized in that the angle of deformation in the deformed regions is greater than 60°.

9. A method for producing a layer structure as claimed in claim 1, comprising the following steps:
  (a) providing a substrate,
  (b) applying the layers of the ACPEL arrangement (2), an insulation layer, and the switch by a printing method, and
  (c) shaping the layer structure.

10. The method as claimed in claim 9, characterized in that the printing method is screen printing.

11. The method as claimed in claim 9, characterized in that the deformation is performed by isostatic high-pressure shaping or thermoforming.

12. The method as claimed in claim 9, characterized in that the layer structure is injected using a plastic.

13. A use of a layer structure as claimed in claim 1 to form display and control elements.

14. A use of a layer structure as claimed in claim 1 to form housing elements for mobile or stationary electronic equipment, or small or large household appliances, or to form keyboard systems without moving parts.

15. The layer structure as claimed in claim 1, characterized in that the rear electrode of the ACPEL arrangement and the front and the rear electrodes of the switch, independently of one another, contain at least 30 wt.-% of an intrinsically conductive polymer, or at least 50 wt.-% silver, and the front electrode of the ACPEL arrangement contains at least 30 wt.-% of an intrinsically conductive polymer.

16. The layer structure as claimed in claim 1, characterized in that the rear electrode of the ACPEL arrangement and the front and the rear electrodes of the switch, independently of one another, contain at least 40 wt.-% of an intrinsically conductive polymer, or at least 60 wt.-% silver, and the front electrode of the ACPEL arrangement contains at least 40 wt.-% of an intrinsically conductive polymer.

17. The layer structure as claimed in claim 5, characterized in that the insulation layer is between 30 and 80 μm thick.

18. The layer structure as claimed in claim 5, characterized in that the insulation layer is between 40 and 70 μm thick.

19. The layer structure as claimed in claim 1, characterized in that the radii of curvature in the deformed regions are smaller than 1 mm.

20. The layer structure as claimed in claim 1, characterized in that the angle of deformation in the deformed regions is greater than 90°.

* * * * *